(12) United States Patent
Kim et al.

(10) Patent No.: US 7,567,093 B2
(45) Date of Patent: Jul. 28, 2009

(54) SEMICONDUCTOR MEMORY DEVICE WITH ON-DIE TERMINATION CIRCUIT

(75) Inventors: Kwan-Weon Kim, Kyoungki-do (KR); Jeong-Woo Lee, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 206 days.

(21) Appl. No.: 11/819,800

(22) Filed: Jun. 29, 2007

(65) Prior Publication Data
US 2008/0074139 A1    Mar. 27, 2008

(30) Foreign Application Priority Data
Sep. 27, 2006   (KR) .................. 10-2006-0094050

(51) Int. Cl.
*H03K 17/16* (2006.01)
(52) U.S. Cl. .......................... 326/30; 326/27
(58) Field of Classification Search ............. 326/21, 326/22, 26, 27, 30, 82–87
See application file for complete search history.

(56) References Cited

U.S. PATENT DOCUMENTS

| | | | |
|---|---|---|---|
| 6,157,206 A | 12/2000 | Taylor et al. | |
| 7,019,555 B2 | 3/2006 | Lee | |
| 7,034,567 B2 | 4/2006 | Jang | |
| 7,414,426 B2 * | 8/2008 | Cox et al. | 326/30 |
| 7,432,731 B2 * | 10/2008 | Bains et al. | 326/30 |
| 7,486,104 B2 * | 2/2009 | Oh et al. | 326/30 |
| 2005/0180229 A1 | 8/2005 | Jin | |
| 2005/0268059 A1 | 12/2005 | LaBerge | |
| 2008/0309368 A1* | 12/2008 | Park | 326/30 |

FOREIGN PATENT DOCUMENTS

| | | |
|---|---|---|
| JP | 2004-310981 | 11/2004 |
| JP | 2005-228458 | 8/2005 |
| KR | 10-2003-0006525 | 1/2003 |
| KR | 10-2006-0038745 | 5/2006 |

OTHER PUBLICATIONS

Korean Notice of Allowance issued in Korean Patent Application No. KR 10-2006-0094050, mailed Jun. 24, 2008.

* cited by examiner

*Primary Examiner*—Don P Le
(74) *Attorney, Agent, or Firm*—Mannava & Kang, P.C.

(57) ABSTRACT

A semiconductor memory device is able to inactivate an on-die termination circuit without an additional pin. The semiconductor memory device includes a control signal generator, a resistance control unit, and a resistance supply unit. The control signal generator generates an initializing signal and driving clocks in response to a plurality of control signals. The resistance control unit, initialized by the initializing signal, generates a termination-off signal in response to the driving clocks. The resistance supply unit supplies termination resistance in response to the termination-off signal and a mode register setting value. The plurality of control signals are inputted through input pins not connected to the resistance supply unit.

10 Claims, 9 Drawing Sheets

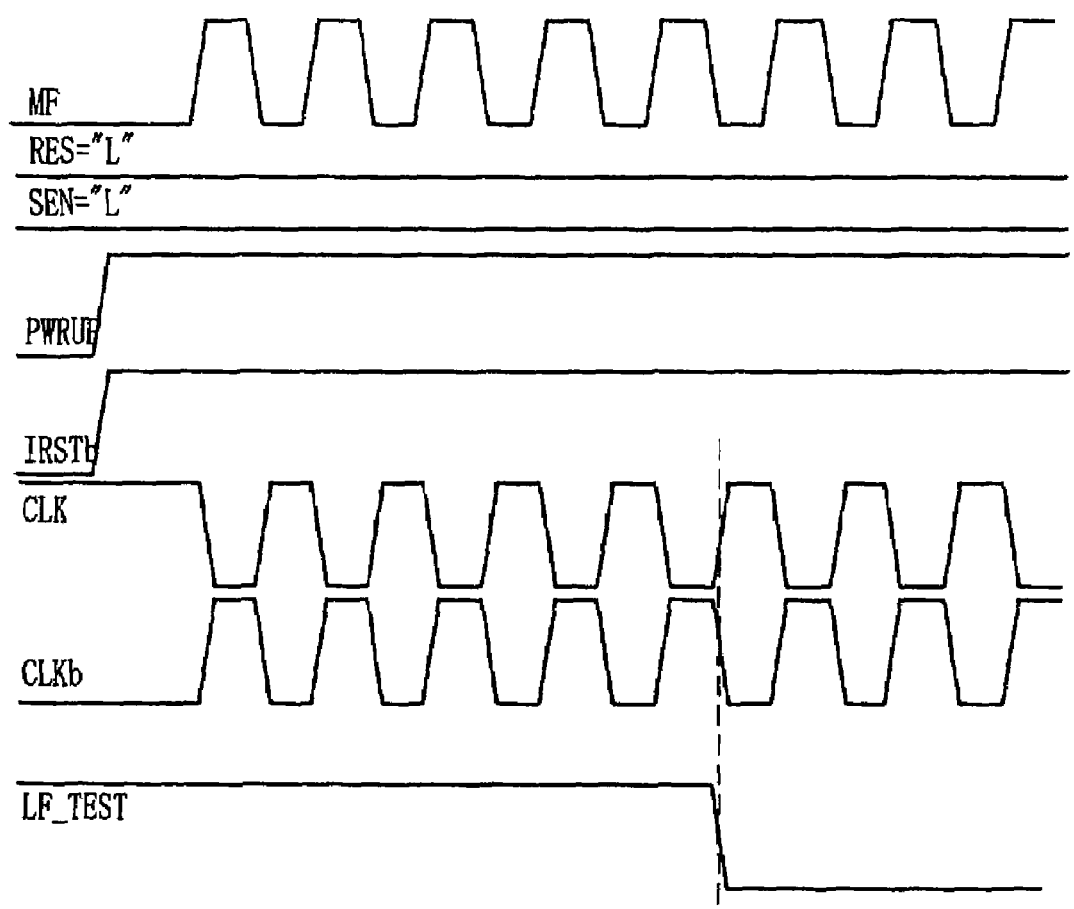

RES="L"

SEN="H"

RES_RENb="H"

PWRUP

IRSTb="L"

CLK="H"

CLKb="L"

LF_TEST="H"

SEMICONDUCTOR MEMORY DEVICE WITH ON-DIE TERMINATION CIRCUIT

CROSS-REFERENCE TO RELATED APPLICATIONS

The present invention claims priority of Korean patent application no. 10-2006-0094050, filed in the Korean Patent Office on Sep. 27, 2006, which is incorporated by reference in its entirety.

BACKGROUND OF THE INVENTION

The present invention relates to a semiconductor memory device; more particularly, to a semiconductor memory device capable of inactivating an on-die termination circuit without an additional pin.

A variety of semiconductor devices embodied by an integrated circuit chip, such as a CPU, a memory and a gate array, have been combined in electrical products such as a personal computer, a server and an work station. Most of the semiconductor devices include an input circuit for receiving external signals through an input pad and an output circuit for outputting internal signals through an output pad.

As an operation speed of electrical products has increased, swing width of signals transmitted between semiconductor memory devices is required to decrease in order to minimize a delay time taken to transmit the signals. However, as the swing width of signals decreases, signal transmission is more affected by external noises and signal reflection in an interface terminal increases by impedance mismatching.

The impedance mismatching is caused by variation of a manufacture process, a supply voltage and an operation temperature (PVT). The impedance mismatching makes it hard to transmit data at a high speed. Because data outputted from a semiconductor device may be distorted by the impedance mismatching, malfunctions such as a set up/hold fail and misjudgment of data level could be caused in a corresponding semiconductor device receiving the distorted data.

Accordingly, a semiconductor device that a high operating speed is required of includes an impedance matching circuit, called on-die termination, near an I/O pad. Generally, a source termination is performed by an output circuit in a semiconductor device transmitting data. A parallel termination is performed by a termination circuit parallelly connected to an input circuit in a semiconductor device receiving data.

FIG. 1 is a block diagram illustrating an on-die termination circuit of a conventional semiconductor memory device. The on-die termination circuit includes a controlling unit 10 and an ODT output driver 20.

The controlling unit 10 controls a termination resistance by an external setting. The controlling unit 10 includes a control signal generator 12 and a buffer 14. The control signal generator 12 decodes an extend mode register set (EMRS) set externally and outputs control signals ODT_PU<1:3> and ODT_PD<1:3>. The buffer 14 buffers the control signals ODT_PU<1:3> and ODT_PD<1:3>. The buffer 14 compensates for decrease of the control signals ODT_PU<1:3> and ODT_PD<1:3> which are caused by noises when the control signal generator 12 is far from the ODT output driver 20. Accordingly the buffer 14 is unnecessary when the control signal generator 12 is close to the ODT driver 20.

The ODT driver 20 includes a plurality of output drivers 22, 24 and 26 turning on or off in response to the control signals ODT_PU<1:3> and ODT_PD<1:3>. Because output nodes of the output drivers 22, 24 and 26 are connected in common, each output driver is parallelly connected at the output node. As the number of the output drivers turning on by the control signals ODT_PU<1:3> and ODT_PD<1:3> increases, the number of resistors connected in parallel increases. Accordingly, the termination resistance decreases. On the other hand, as the number of the output drivers turning on decreases, the termination resistance increases. It is possible to control the termination resistance by setting the ERMS externally.

A method for estimating the termination resistance with respect to turn-on resistors of output drivers 22, 24 and 26 is described below. When each turn-on resistor of the output drivers has a resistance of 150 Ω and all output drivers are turned on, three turn-on resistors having the resistance of 150 Ω are connected in parallel. The termination resistance becomes 50 Ω. When two of output drivers are turned on, two of turn-on resistors are connected in parallel and the termination resistance becomes 75 Ω. When one of output drivers is turned on, the termination resistance becomes 150 Ω.

Accordingly, the termination resistance is able to be controlled by setting the EMRS externally. If required resistance is set into the EMRS, the control signal generator generates the control signals in order to turn on the output drivers according to the required resistance.

For example, when a resistance of 50 Ω is set into the EMRS, the control signal generator 14 enables all control signals ODT_PU<1:3> and ODT_PD<1:3> in order to turn on all output drivers 22, 24 and 26. When a resistance of 75 Ω is set into the EMRS, the control signal generator 14 enables corresponding control signals ODT_PU<1:2> and ODT_PD<1:2> in order to turn on two of output drivers 22, 24 and 26. When a resistance of 150 Ω is set into the EMRS, the control signal generator 14 enables corresponding control signals ODT_PU<1> and ODT_PD<1> in order to turn on one of output drivers 22, 24 and 26.

Meanwhile a semiconductor memory device with the above-mentioned on-die termination circuit can not receive commands or addresses from a part of test devices at multiple test operations. A plurality of test devices are connected to a semiconductor memory device in parallel and simultaneously perform test operations in order to perform the test operations fast. Because the plurality of test devices have different drivabilities from each other, commands or addresses from test devices having relatively less drivability can not be inputted into the semiconductor memory device due to decline of the drivability by the on-die termination circuit. On the other hand, test devices having relatively more drivability can perform test operations normally without decline of the drivability by the on-die termination circuit.

That is, each test device has its own output resistance and the termination resistance of the semiconductor memory device should be set to each output resistance. However, because the test devices are connected in parallel and operate simultaneously, the termination resistance of the semiconductor memory device is set to one resistance estimated in parallel. Accordingly, the test device having relatively less drivability among the plurality of test devices can not perform test operations normally.

In order to solve above mentioned problem, the conventional on-die termination circuit is turned off at the test operation. An additional pin through which a termination-off signal is inputted should be provided to turn off the on-die termination circuit at the test operation. When the termination-off signal is enabled, the control signal generator disables all control signals for the on-die termination circuit. The on-die termination circuit is turned off. However, it is difficult to provide the additional pin at the test operation.

SUMMARY OF THE INVENTION

Embodiments of the present invention are directed to providing a semiconductor memory device for being able to inactivate an on-die termination circuit without an additional pin.

In accordance with an aspect of the present invention, a semiconductor memory device includes a control signal generator for generating an initializing signal and driving clocks in response to a plurality of control signals, a resistance control unit, initialized by the initializing signal, for generating a termination-off signal in response to the driving clocks, and a resistance supply unit for supplying termination resistance in response to the termination-off signal and a mode register setting value, wherein the plurality of control signals are inputted through input pins not connected to the resistance supply unit.

BRIEF DESCRIPTION OF THE DRAWINGS

FIG. 4b is a schematic circuit diagram illustrating a first flip flop described in FIG. 4a.

FIG. 5 is a signal timing diagram illustrating an operation of a semiconductor memory in accordance with the present invention in a termination-off mode.

FIGS. 7a to 7b are signal timing diagrams illustrating an operation of the semiconductor memory device in accordance with the present invention in a boundary scan test.

DESCRIPTION OF SPECIFIC EMBODIMENTS

Hereinafter, a semiconductor memory device in accordance with the present invention will be described in detail referring to the accompanying drawings.

Figure 1:
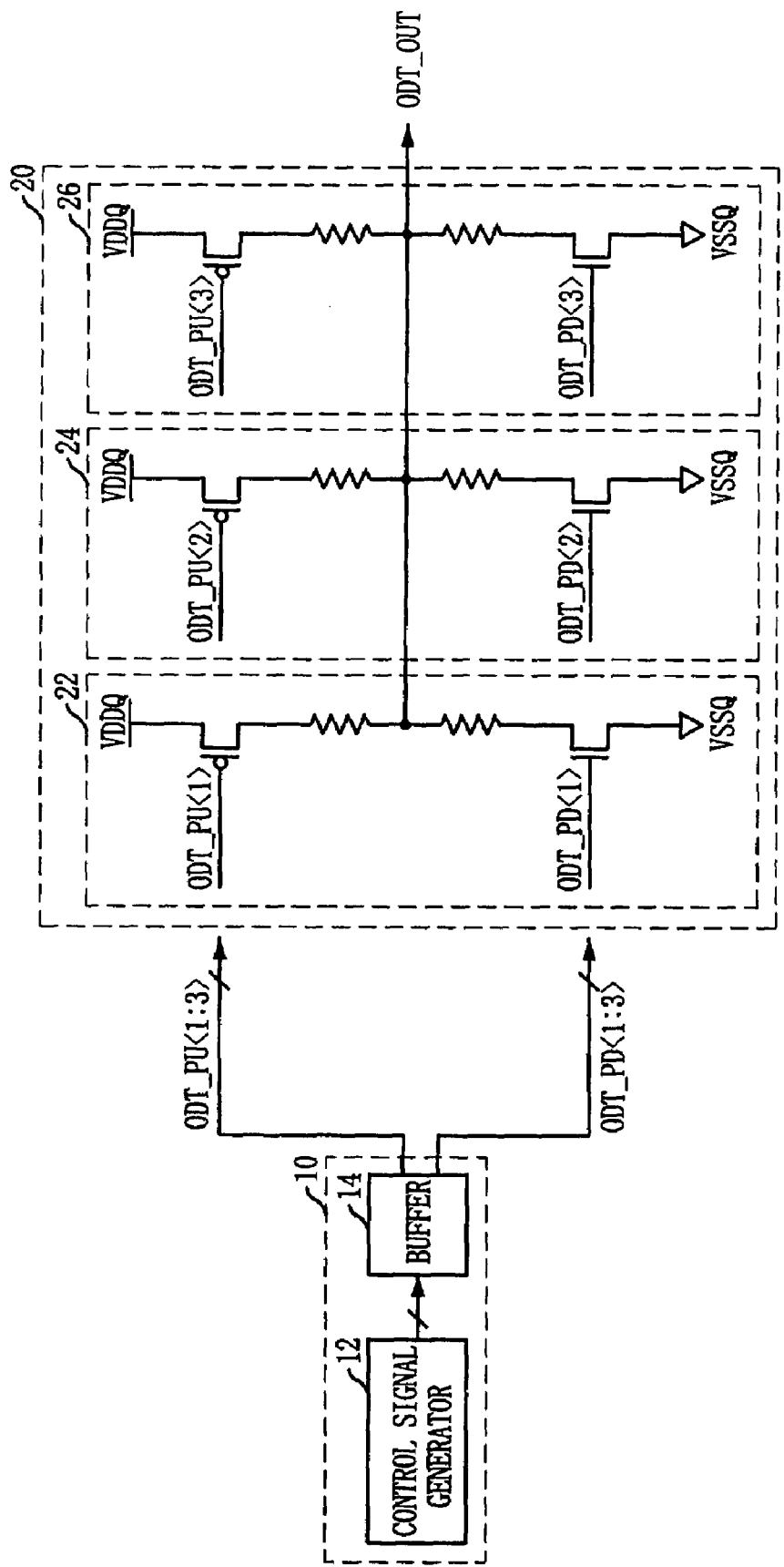
FIG. 1 is a block diagram illustrating a conventional on-die termination circuit.
Figure 2:
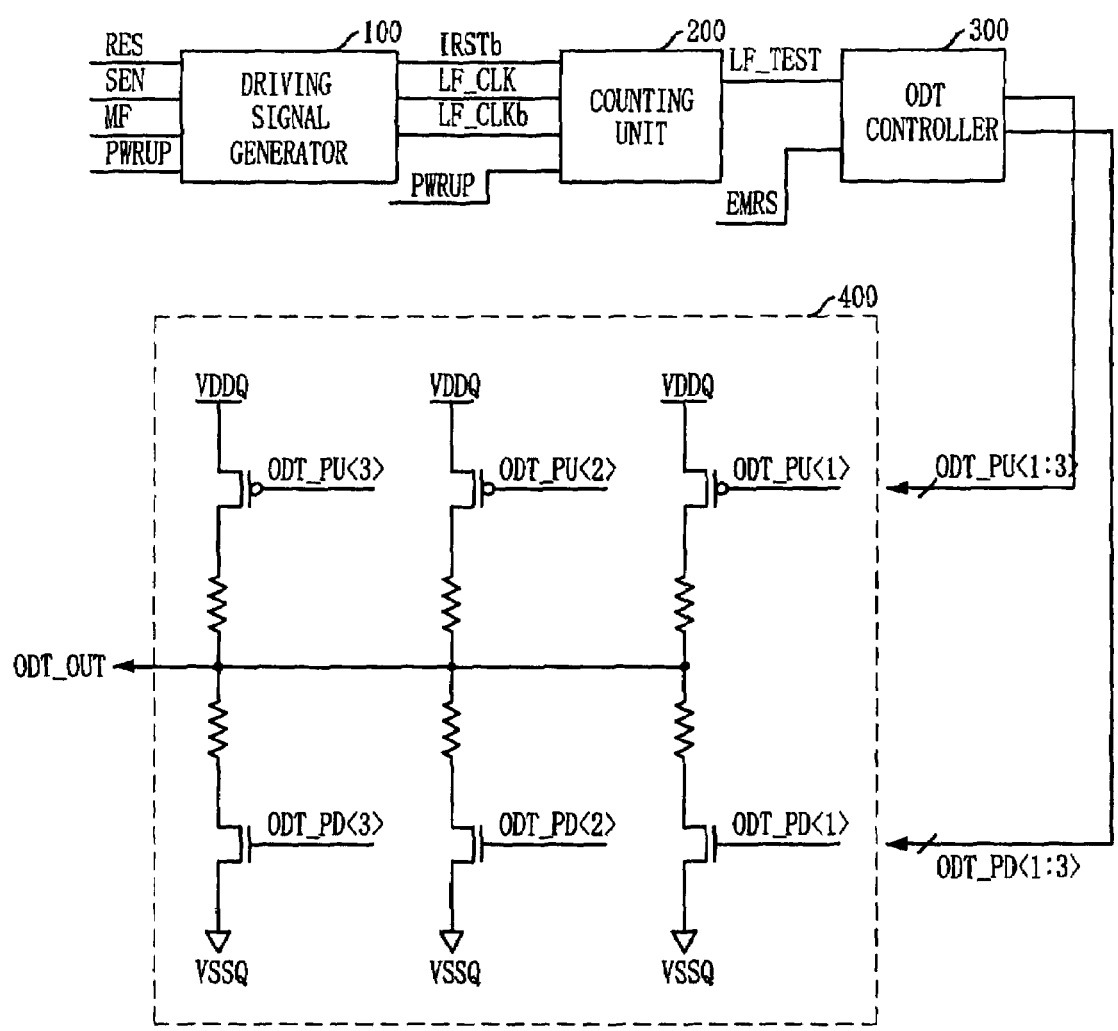
FIG. 2 is a block diagram illustrating a semiconductor memory device with an on-die termination circuit in accordance with the present invention.

FIG. 2 is a block diagram illustrating a semiconductor memory device with an on-die termination circuit in accordance with the present invention. The semiconductor memory device includes a driving signal generator 100, a counting unit 200, an ODT controller 300, and an ODT output driver 400.

The driving signal generator 100 receives a boundary-test entry signal SEN, a boundary-test output control signal MF and a boundary-test shift signal RES, thereby to generate an initializing signal IRSTb and driving clocks LF_CLK and LF_CLKb. The counting unit 200 counts the driving clocks LF_CLK and LF_CLKb, thereby to generate a termination-off signal LF_TEST. The ODT controller 300 receives the termination-off signal LF_TEST and an EMRS signal EMRS, thereby to generate a plurality of pull-up and pull-down control signals ODT_PU<1:3> and ODT_PD<1:3>. The ODT output driver 400 provides a termination resistance ODT_OUT in response to the plurality of pull-up and pull-down control signals ODT_PU<1:3> and ODT_PD<1:3>.

The boundary-test entry signal SEN, the boundary-test output control signal MF and the boundary-test shift signal RES are used during a boundary scan test. The boundary scan test is a test performed to check whether pin balls of a packaged semiconductor memory device are accurately connected. The boundary scan test begins to be performed when the boundary test entry signal SEN is enabled. A result of the boundary scan test is outputted when the boundary test output control signal MF is enabled. The boundary-test shift signal RES is for shifting the boundary scan test. In addition, the boundary-test shift signal RES is used as a reset signal RESET and the boundary-test output control signal MF is used to activate a mirror function, in a normal operation.

Accordingly, a semiconductor memory device in accordance with the present invention is able to turn off an on-die termination circuit through a combination of signals used during a boundary scan test without additional pins. Moreover, input pins of the signals SEN, MF and RES used during the boundary scan test are not connected to the on-die termination circuit. Without respect to an operation of the on-die termination circuit, the on-die termination circuit may be turned off by inputting the signals SEN, MF and RES. The signals SEN, MF and RES are able to be inputted without signal distortion even if the on-die termination circuit is turned on. The on-die termination circuit may be turned off at any moment of a test.

Figure 3:
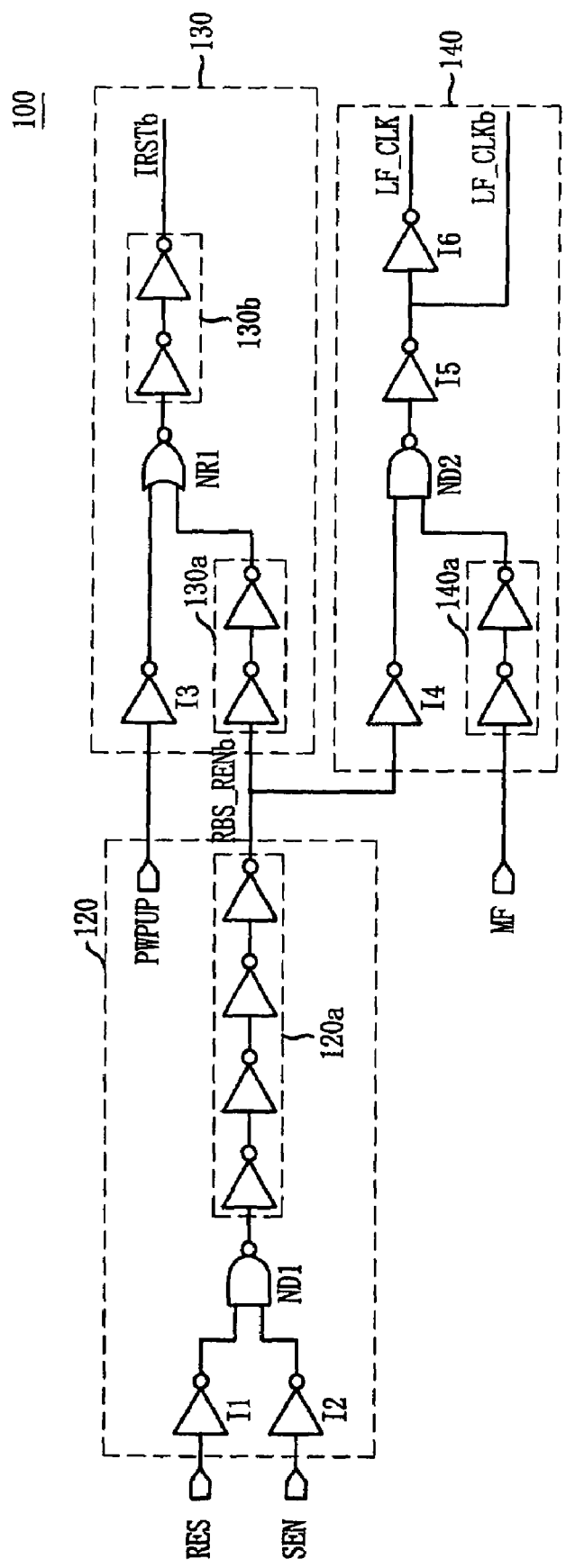
FIG. 3 is a schematic circuit diagram illustrating a driving signal generator described in FIG. 2.

FIG. 3 is a schematic circuit diagram illustrating the driving signal generator 100 described in FIG. 2. The driving signal generator 100 includes a signal combination unit 120, an initializing signal generator 130 and a driving clock generator 140.

The signal combination unit 120 receives the boundary-test entry signal SEN and the boundary-test shift signal RES, thereby to output a combination signal RBS_RENb. The combination signal generator 120 includes inverters I1 and I2, a first NAND gate ND1 and a first inverter chain 120a. First and second inverters I1 and I2 invert the boundary-test shift signal RES and the boundary-test entry signal SEN, respectively. The first NAND gate ND1 performs a logic operation on outputs of the first and second inverters I1 and I2. The first inverter chain 120a delays an output of the first NAND gate ND1, thereby to output the combination signal RBS_RENb.

The initializing signal generator 130 outputs an initializing signal IRSTb in response to the combination signal RBS_RENb and a power-up signal PWRUP. The initializing signal generator 130 includes a third inverter I3, a NOR gate NR1 and inverter chains 130a and 130b. The third inverter I3 inverts the power-up signal PWRUP. A second inverter chain 130a delays the combination signal RBS_RENb. The NOR gate NR1 performs a logic operation on outputs of the third inverter I3 and the second inverter chain 130a. A third inverter chain 130b delays an output of the NOR gate NR1, thereby to output the initializing signal IRSTb.

The driving clock generator 140 outputs driving clocks LF_CLK and LF_CLKb in response to the combination signal RBS_RENb and a boundary-test output control signal MF. The driving clock generator 140 includes inverters I4, I5 and I6, a fourth inverter chain 140a and a second NAND gate ND2. A fourth inverter I4 inverts the combination signal RBS_RENb. The fourth inverter chain 140a delays the boundary-test output control signal MF. The second NAND gate ND2 performs a logic operation on outputs of the fourth inverter I4 and the fourth inverter chain 140a. A fifth inverter I5 inverts an output of the second NAND gate ND2, thereby to output an inverted driving clock LF_CLKb. A sixth inverter I6 inverts an output of the fifth inverter I5, thereby to output non-inverted driving clock LF_CLK.

Figure 4A:
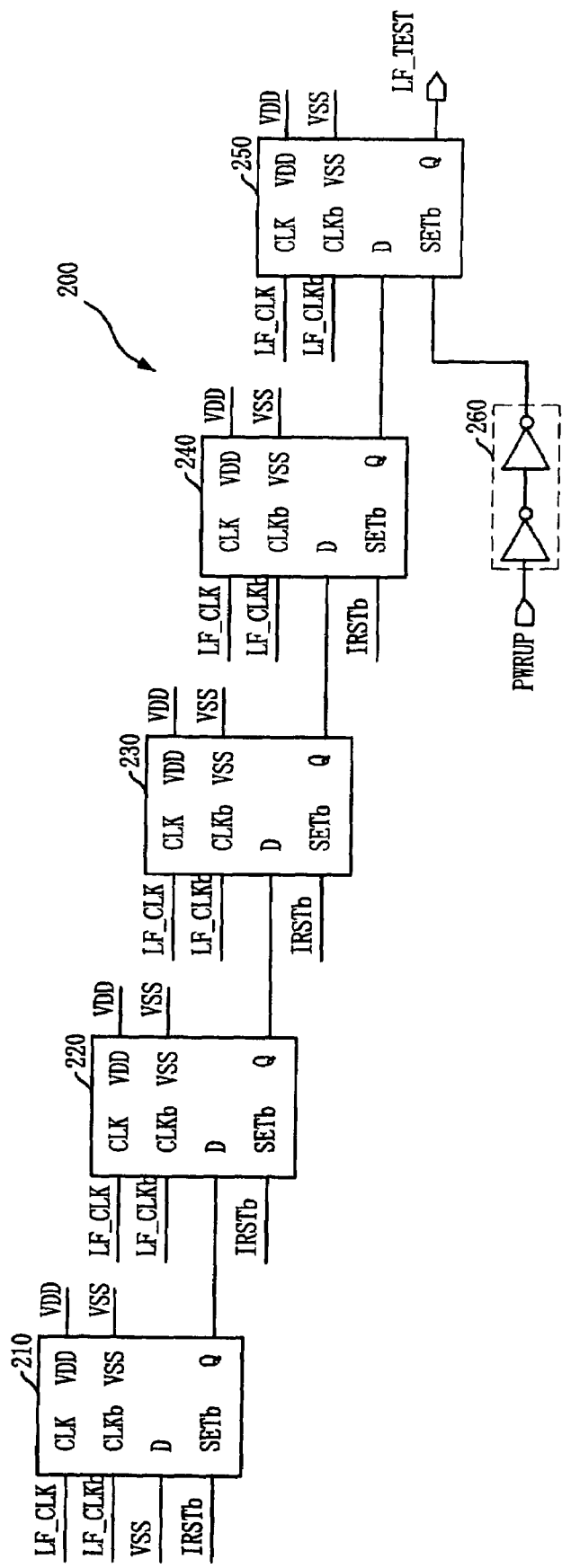
FIG. 4a is a schematic circuit diagram illustrating a counting unit described in FIG. 2.

FIG. 4A is a schematic circuit diagram illustrating the counting unit 200 described in FIG. 2. The counting unit 200 includes flip-flops 210 to 250 in series. The flip-flops 210 to 250 are initialized by the initializing signal IRSTb or the power-up signal PWRUP. Each flip-flop stores an output of its pre-one and outputs the stored output in response to the driving clocks LF_CLK and LF_CLKb.

The flip-flops 210 to 250 receive driving clocks LF_CLK and LF_CLKb through clock signal pin CLK and inverted clock signal pin CLKb, respectively. The first flip-flop 210 receives a ground voltage VSS through a data pin D and the others 220 to 250 receives the output of each pre-one through a data pin D. The first to fourth flip-flops 210 to 240 receive the initializing signal IRSTb through a set signal pin SETb and the fifth flip-flop 250 receives the power-up signal PWROP delayed by a fifth inverter chain 260 through a set signal pin SETb. Analyzing an operation of the counting unit 200 briefly, the counting unit 200 enables the termination-off signal LF_TEST as a logic low level L at a fifth activation of the driving clocks LF_CLK and LF_CLKb.

Figure 4B:
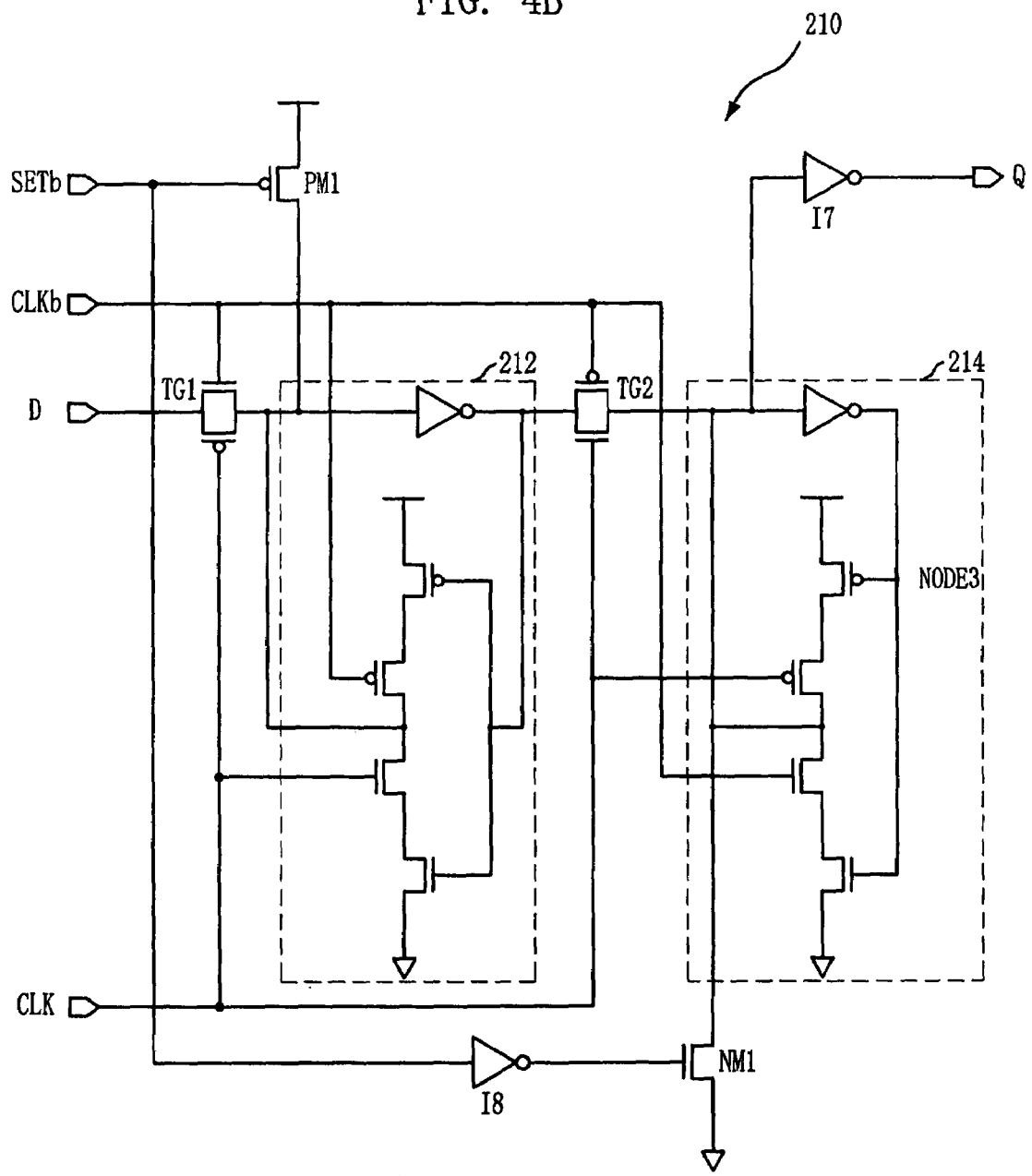

FIG. 4B is a schematic circuit diagram illustrating the first flip flop 210 described in FIG. 4A. The first to fifth flip-flops 210 to 250 have the substantially same structure and input signals inputted to the flip-flops 210 to 250 are different. Accordingly, the first flip-flop 210 is described herein.

The first flip-flop 210 includes transmission gates TG1 and TG2, latches 212 and 214, a seventh inverter I7, and initialization units.

A first transmission gate TG1 transmits a signal from the data pin D in response to a disablement of the driving clocks LF_CLK and LF_CLKb. A first latch 212 stores an output of the first transmission gate TG1 when the driving clocks LF_CLK and LF_CLKb are enabled. A second transmission gate TG2 transmits a signal stored in the first latch 212 in response to the enablement of the driving clocks LF_CLK and LF_CLKb. A second latch 214 stores an output of the second transmission gate TG2 when the driving clocks LF_CLK and LF_CLKb are disabled. The seventh inverter I7 inverts the output of the second transmission gate TG2 and outputs the inverted signal through an output pin Q.

First and second initialization units initialize output nodes of the first and second transmission gates TG1 and TG2, respectively, in response to a signal from the set signal pin SETb. The first initialization unit includes a PMOS transistor PM1 for providing the output node of the first transmission gate TG1 with a supply voltage VDD in response to the signal from the set signal pin SETb. The second initialization unit includes an eighth inverter I8 for inverting the signal from the set signal pin SETb and a NMOS transistor NM1 for providing the output node of the second transmission gate TG2 with the ground voltage VSS in response to an output of the eighth inverter I8.

Briefly analyzing an operation of the first flip-flop 210, a signal input from the data pin D is stored in response to the inactivation of driving clocks LF_CLK and LF_CLKb. And then, the stored signal is outputted through the output pin Q in response to the activation of driving clocks LF_CLK and LF_CLKb. A logic high level H is outputted through the output pin Q in response to the initializing signal IRSTb inputted from the set signal pin SETb.

FIG. 5 is a signal timing diagram illustrating an operation of a semiconductor memory in accordance with the present invention. The signal timing diagram at the activation of the termination-off signal LF_TEST is described.

The boundary-test entry signal SEN and the boundary-test shift signal RES are disabled in a logic low level L and the boundary-test output control signal MF is toggled, which is a combination of signal states not used in the boundary scan test. The signal combination unit 120 enables the combination signal RBS_RENb to a logic low level L in response to the logic low level L of the boundary-test entry signal SEN and boundary-test shift signal RES.

The initializing signal generator 130 disables the initializing signal IRSTb to a logic high level H in response to the combination signal RBS_RENb of a logic low level L and the power-up signal PWRUP of a logic high level H. The driving clock generator 140 outputs the driving clocks LF_CLK and LF_CLKb by inverting and delaying the boundary-test output control signal MF during the activation of the combination signal RBS_RENb. The counting unit 200 enables the termination-off signal LF_TEST to a logic low level L at a fifth rising edge of the driving clock LF_CLK.

Figure 6A:
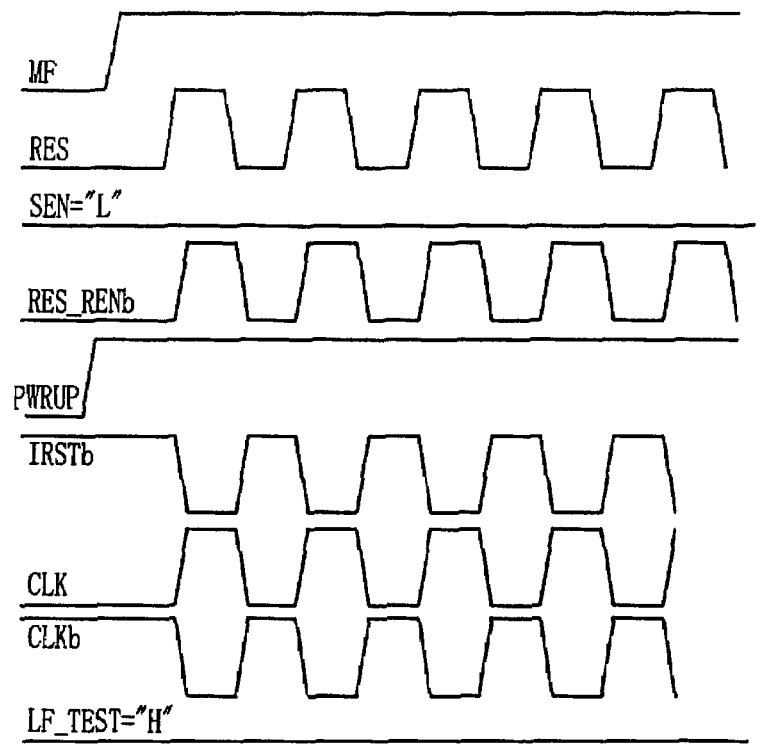
FIGS. 6a to 6c are signal timing diagrams illustrating an operation of a semiconductor memory in accordance with the present invention in a normal mode.
Figure 6B:
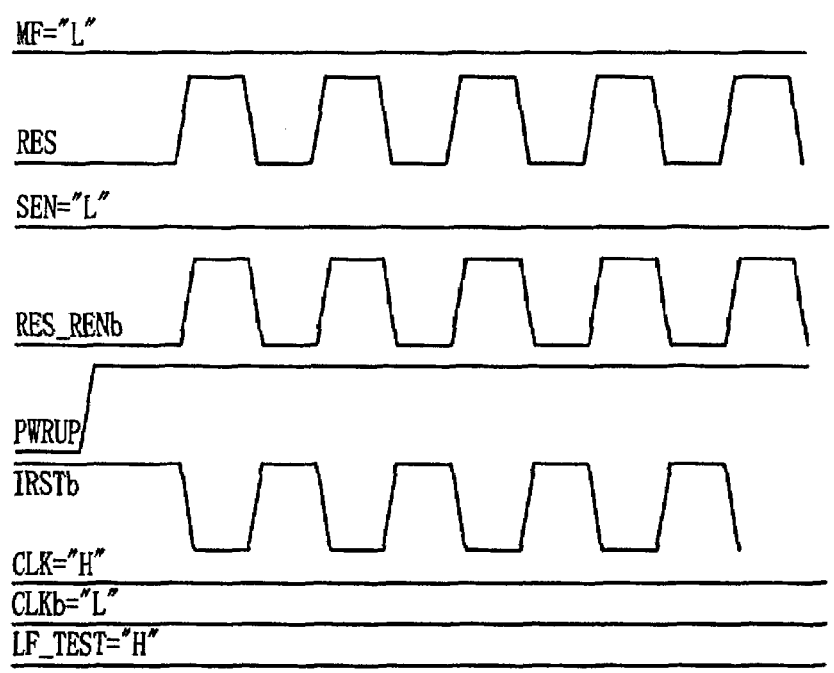
Figure 6C:
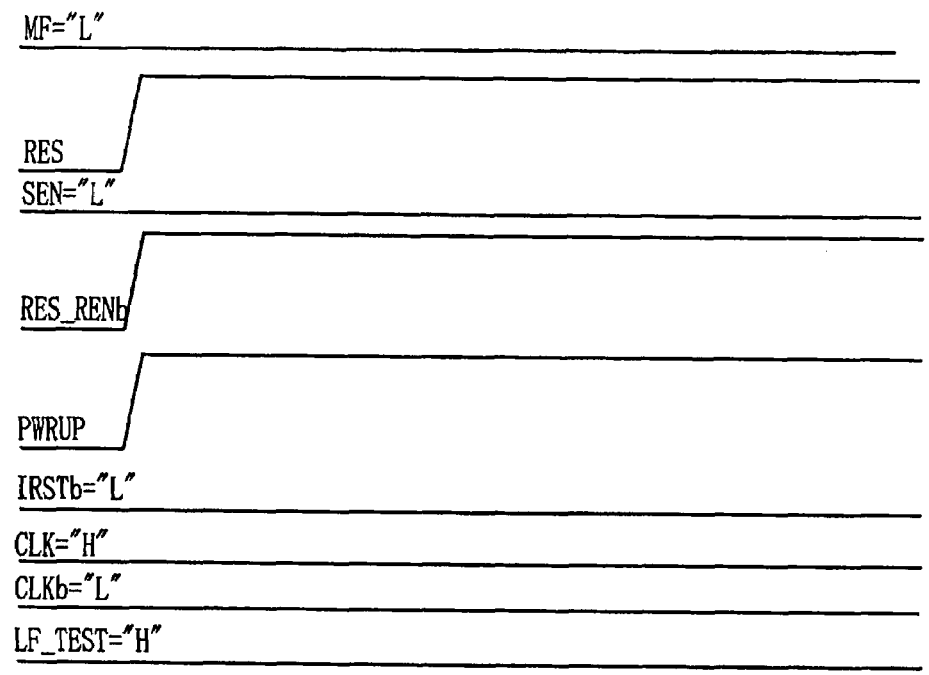

FIGS. 6A to 6C are signal timing diagrams illustrating an operation of a semiconductor memory in accordance with the present invention in a normal mode. In the normal mode, the boundary-test entry signal SEN has a logic low level L. Accordingly, the signal combination unit 120 outputs the combination signal RBS_RENb in response to the logic level of the boundary-test shift signal RES.

Referring to FIGS. 6A and 6B, the combination signal RBS_RENb is toggled as the boundary-test shift signal RES is toggled. The initializing signal generator 130 outputs the initializing signal IRSTb by inverting the combination signal RBS_RENb while the power-up signal PWRUP has a logic high level H. Accordingly, the initializing signal IRSTb is toggled and the flip-flops 210 to 250 of the counting unit 200 are initialized by the initializing signal IRSTb without reference to the driving clocks. Therefore the termination-off signal LF_TEST is disabled to a logic high level H.

Referring to FIG. 6C, the combination signal RBS_RENb is disabled to a logic high level H in response to an activation of the boundary-test shift signal RES. The initializing signal generator 130 enables the initializing signal IRSTb to a logic low level L in response to the combination signal RBS_RENb of a logic high level H and the power-up signal PWRUP of a logic high level H. The driving clock generator 140 outputs the non-inverted driving clock LF_CLK of a logic high level H and the inverted driving clock LF_CLKb of a logic low level L in response to an inactivation of the boundary-test output control signal MF. While the driving clocks LF_CLK and LF_CLKb are not toggled, the counting unit 200 disables the termination-off signal LF_TEST to a logic high level H in response to the initializing signal IRSTb of a logic low level L.

As described in FIGS. 6A to 6C, the semiconductor memory device in accordance with the present invention disables the termination-off signal LF_TEST in response to the logic levels which the boundary-test entry signal SEN, the boundary-test shift signal RES and the boundary-test output control signal MF have in the normal mode. That is, the on-die termination circuit is not turned off by the logic level combination of the boundary-test entry signal SEN, the boundary-test shift signal RES and the boundary-test output control signal MF in the normal mode.

Figure 7A:
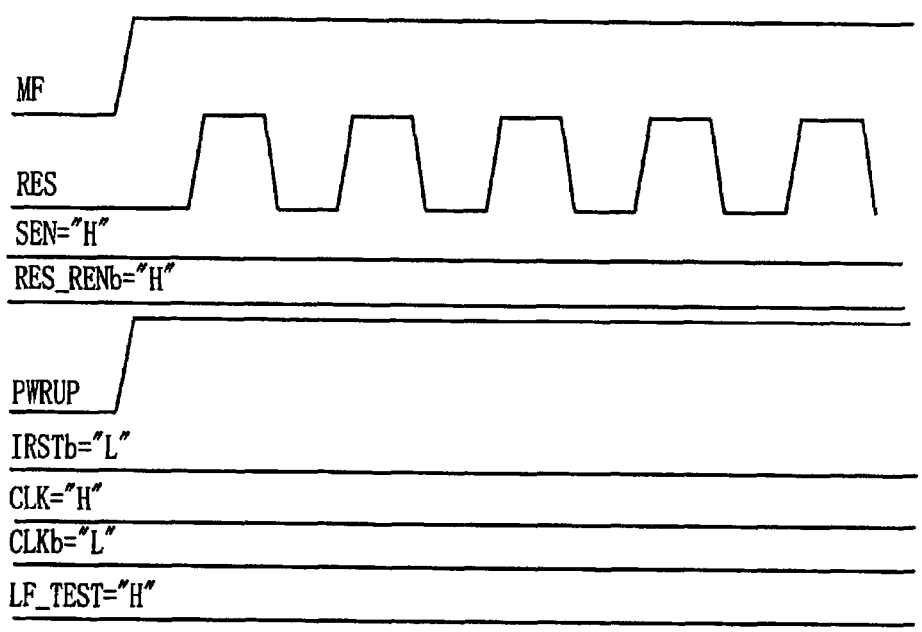

FIGS. 7A and 7B are signal timing diagrams illustrating an operation of the semiconductor memory device in accordance with the present invention in the boundary scan test.

In the boundary scan test, the boundary-test entry signal SEN has a logic high level H. Accordingly, the signal combination unit 120 outputs the combination signal RBS_RENb of a logic high level H without reference to the logic level of the boundary-test shift signal RES.

Referring to FIGS. 7A and 7B, the boundary-test shift signal RES is toggled or disabled to a logic low level L. However, the combination signal RBS_RENb is always disabled to logic high level H in response to the logic level of the boundary-test entry signal SEN. Accordingly, the initializing signal generator 130 enables the initializing signal IRSTb to a logic low level L in response to the combination signal RBS_RENb of a logic high level H and the power-up signal PWRUP of a logic high level H.

The driving clock generator 140 outputs the non-inverted driving clock LF_CLK in a logic high level H and the inverted driving clock LF_CLKb of a logic low level L in response to the combination signal RBS_RENb of a logic high level H, whatever the logic level of the boundary-test output control signal MF is, referring to FIGS. 7A and 7B. While the driving clocks LF_CLK and LF_CLKb are not toggled, the counting unit 200 disables the termination-off signal LF_TEST to a logic high level H in response to the initializing signal IRSTb in a logic low level L.

As illustrated in FIGS. 7A to 7B, the semiconductor memory device in accordance with the present invention disables the termination-off signal LF_TEST in response to the logic levels which the boundary-test entry signal SEN, the boundary-test shift signal RES and the boundary-test output control signal MF have in the boundary scan test. That is, the on-die termination circuit is not turned off by the logic level combination of the boundary-test entry signal SEN, the boundary-test shift signal RES and the boundary-test output control signal MF in the boundary scan test.

In accordance with the present invention, the termination-off signal is generated by the combination of signals input through input pins which are not connected to the on-die termination circuit. The on-die termination circuit of the present invention can be turned off without additional pins which are required for the input of the termination-off signal in the conventional on-die termination circuit. In addition, the termination-off signal is not enabled by the combination of those signals in the boundary scan test or the normal mode. The stability with regard to the operation of the semiconductor memory device can be guaranteed.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   a control signal generator for generating an initializing signal and driving clocks in response to a plurality of control signals;
   a resistance control unit, initialized by the initializing signal, for generating a termination-off signal in response to the driving clocks; and
   a resistance supply unit for supplying termination resistance in response to the termination-off signal and a mode register setting value,
   wherein the plurality of control signals are inputted through input pins not connected to the resistance supply unit.

2. The semiconductor memory device of claim 1, wherein the plurality of control signals used for a boundary scan test include:
   a boundary-test entry signal enabled at the beginning of the boundary scan test; and
   a boundary-test output control signal for controlling the output of results of the boundary scan test.

3. The semiconductor memory device of claim 2, wherein the resistance control unit outputs the termination-off signal disabled in response to the initializing signal and enabled when the driving clocks are enabled over a predetermined number of times.

4. The semiconductor memory device of claim 3, wherein the control signal generator includes:
   a signal combination unit for generating a combination signal in response to a first and a second control signals;
   an initializing signal generator for generating the initializing signal in response to the combination signal and a power-up signal; and
   a driving clock generator for generating the driving clocks in response to the combination signal and a third control signal.

5. The semiconductor memory device of claim 4, wherein the combination signal generator includes:
   a first inverter for inverting the first control signal;
   a second inverter for inverting the second control signal;
   a first logic gate for performing a NAND operation on outputs of the first and the second inverters; and
   a first inverter chain for delaying an output of the first logic gate, thereby outputting the combination signal.

6. The semiconductor memory device of claim 5, wherein the initializing signal generator includes:
   a second inverter chain for delaying the combination signal;
   a third inverter for inverting the power-up signal;
   a second logic gate for performing a NOR operation on outputs of the second inverter chain and the third inverter; and
   a third inverter chain for delaying an output of the second logic gate, thereby outputting the initializing signal.

7. The semiconductor memory device of claim 6, wherein the driving clock generator includes:
   a fourth inverter for inverting the combination signal;
   a fourth inverter chain for delaying the third control signal;
   a third logic gate for performing a NAND operation on outputs of the fourth inverter and the fourth inverter chain;
   a fifth inverter for generating an inverted driving clock by inverting an output of the third logic gate; and
   a sixth inverter for generating a non-inverted driving clock by inverting an output of the fifth inverter.

8. The semiconductor memory device of claim 3, wherein the resistance control unit includes first to fifth flip-flops connected in series which are initialized by the initializing signal or the power-up signal inputted through their set signal pins and latch an output of their previous flip-flop in response to the driving clocks,
   wherein the first flip-flop receives a ground voltage through its data pin and the fifth flip-flop outputs the termination-off signal through its output pin.

9. The semiconductor memory device of claim 8, wherein each of the first to fifth flip-flops includes:
   a first transmission gate for transmitting a signal through a data pin in response to the disablement of the driving clocks;
   a first latch for storing an output of the first transmission gate when the driving clocks are enabled;
   a second transmission gate for transmitting a signal stored in the first latch in response to the enablement of the driving clocks;
   a second latch for storing an output of the second transmission gate when the driving clocks are disabled;
   a first inverter for inverting the output of the second transmission gate and outputting the inverted signal through an output pin; and an initialization unit for initializing output nodes of the first and the second transmission gates in response to a signal input through a set signal pin.

10. The semiconductor memory device of claim 9, wherein the initialization unit includes:

a PMOS transistor for providing the output node of the first transmission gate with a supply voltage in response to the signal from the set signal pin;

a second inverter for inverting the signal from the set signal pin; and a NMOS transistor for providing the output node of the second transmission gate with the ground voltage in response to an output of the second inverter.

\* \* \* \* \*